United States Patent
Gong et al.

(10) Patent No.: US 7,790,237 B2
(45) Date of Patent: Sep. 7, 2010

(54) MULTILAYER FILMS FOR PACKAGE APPLICATIONS AND METHOD FOR MAKING SAME

(75) Inventors: Xiong Gong, Goleta, CA (US); Gang Yu, Santa Barbara, CA (US)

(73) Assignee: CBRITE Inc., Goleta, CA (US)

( * ) Notice: Subject to any disclaimer, the term of this patent is extended or adjusted under 35 U.S.C. 154(b) by 0 days.

(21) Appl. No.: 12/403,202

(22) Filed: Mar. 12, 2009

(65) Prior Publication Data

US 2009/0278277 A1  Nov. 12, 2009

Related U.S. Application Data

(62) Division of application No. 11/358,989, filed on Feb. 21, 2006, now abandoned.

(51) Int. Cl.
*B05D 3/02* (2006.01)
(52) U.S. Cl. .................. 427/402; 427/58; 427/240; 427/256; 427/258; 427/385.5; 427/412.1; 427/421.1; 427/427; 427/427.4; 427/428.01; 427/430.1
(58) Field of Classification Search .......... None
See application file for complete search history.

(56) References Cited

U.S. PATENT DOCUMENTS

| | | | | |
|---|---|---|---|---|
| 5,895,228 A | * | 4/1999 | Biebuyck et al. | 438/99 |
| 6,623,861 B2 | * | 9/2003 | Martin et al. | 428/412 |
| 2002/0125822 A1 | * | 9/2002 | Graff et al. | 313/506 |
| 2004/0195960 A1 | * | 10/2004 | Czeremuszkin et al. | 313/504 |

* cited by examiner

*Primary Examiner*—Erma Cameron
(74) *Attorney, Agent, or Firm*—Parsons & Goltry; Robert A. Parsons; Michael W. Goltry

(57) ABSTRACT

A multilayer film formed by a solution process. The multilayer film includes a plurality of basic film structures positioned in contiguous overlying relationship to form a common multilayer film. Each of the plurality of basic film structures includes one of: a first two-layer structure with a first layer including either a polymer material or an organic material and a second layer including a functionalized inorganic material; a second two-layer structure with a first layer including either a polymer material or an organic material and a second layer including either a polymer binder and/or an organic binder; and a three layer structure with a first layer including either a polymer material or an organic material, a second layer including a functionalized inorganic material, and a third layer including one of a polymer binder and/or an organic binder.

7 Claims, 11 Drawing Sheets

FIG. 2
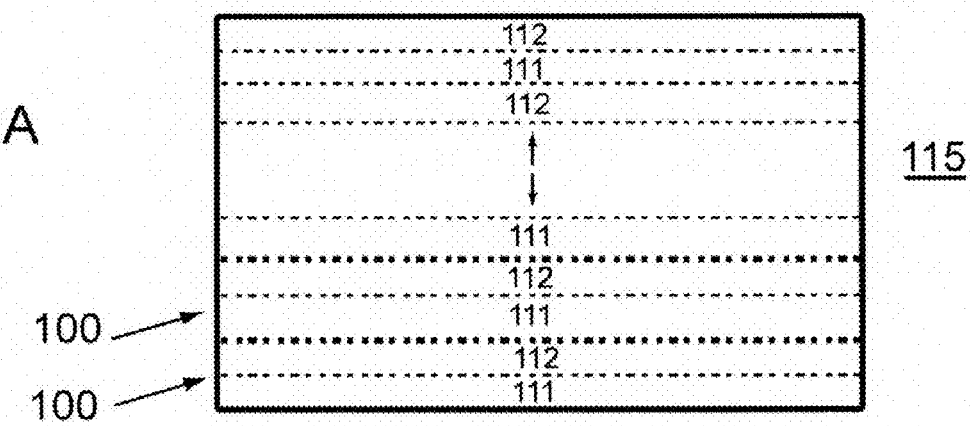
2A
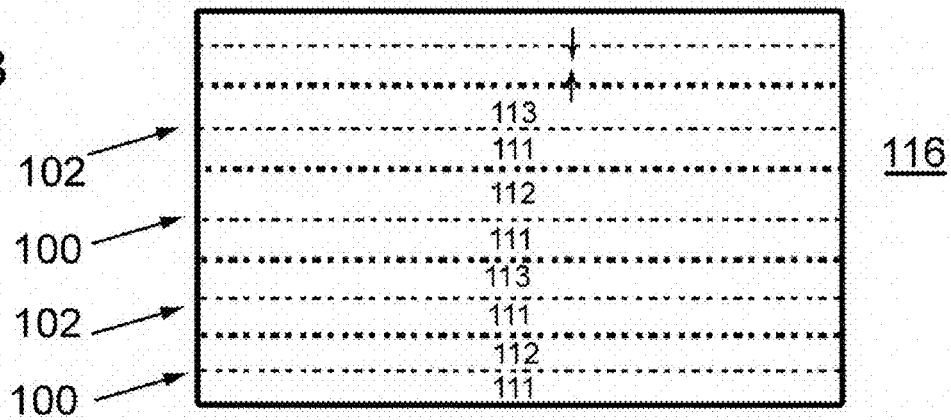
2B
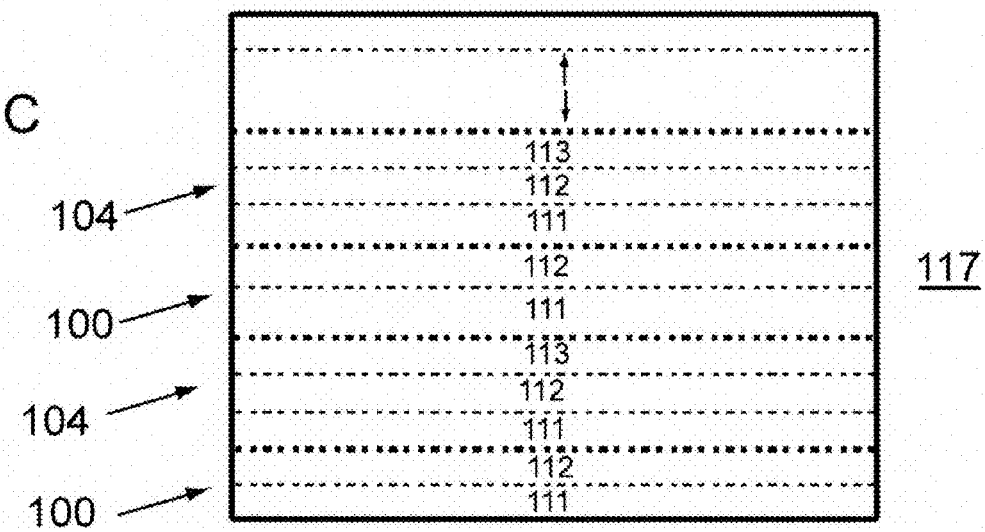
2C

FIG. 3
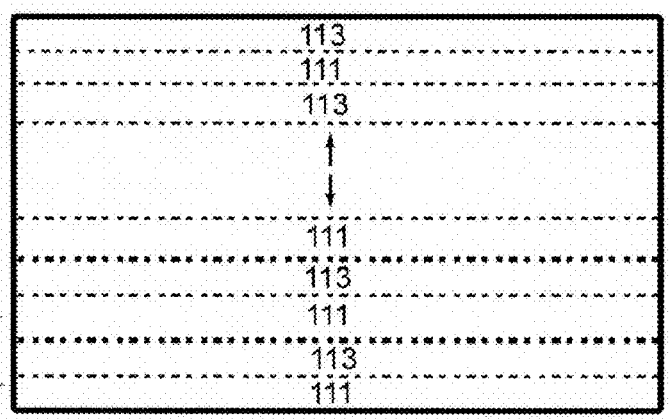
3A
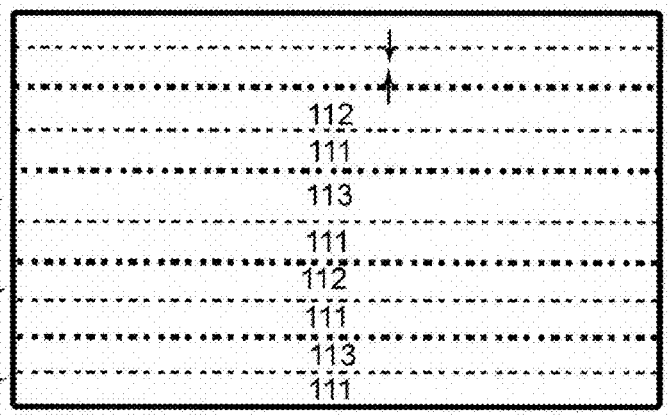
3B
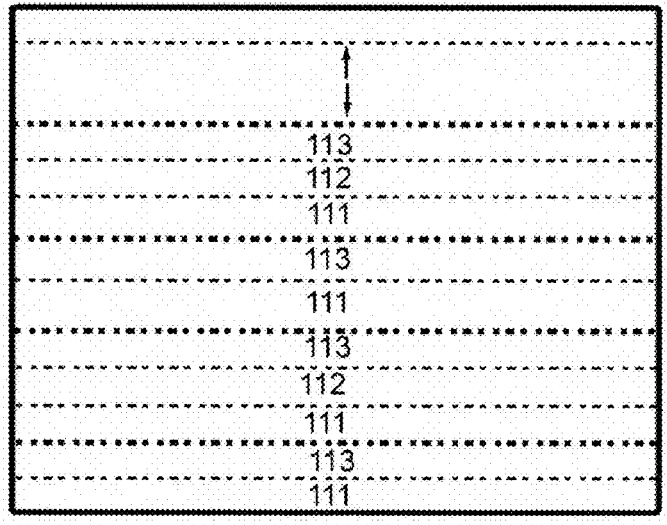
3C

MULTILAYER FILMS FOR PACKAGE APPLICATIONS AND METHOD FOR MAKING SAME

CROSS-REFERENCE TO RELATED APPLICATIONS

This application is a divisional application of currently pending U.S. application Ser. No. 11/358,989, filed 21 Feb. 2009.

FIELD OF THE INVENTION

This invention generally relates to a multilayer film with a small coefficient of thermal expansion and an excellent permeability to water, oxygen, gas and ozone for package applications.

More specifically, the invention can be used as the encapsulation layer for electric, electronic and opto-electric devices, batteries or other electrochemical devices, biosensors, chemsensors, craftworks, plastic containers, stamps, etc.

The present invention further relates to the use of low cost solution dispensing systems and methods for manufacturing of multilayer films.

BACKGROUND OF THE INVENTION

Plastic materials have been used broadly for packaging or carrying substrates and the like. However, their chemical permeability is not as good as those of inorganic glass sheets or metal sheets. There is general interest in improving the barrier properties of plastic sheets. On the other hand, there is also broad interest in thin, conformable packages for devices made on glass substrates or single crystal wafers. There is also interest in thin barrier coated paper for flexible substrates or package materials.

For such conformable packages being used for electric, electronic or opt-electronic devices, picture frames, craftworks, plastic-containers, stamp collections, etc., they should have a small coefficient of thermal expansion, as well as superior permeability to water, oxygen, gas and ozone. In many cases, the packages should also have high optical transparency, good surface flatness and chemical resistance. Glass plates have been used in many of these applications; however, they are fragile and easy to break under external force, which disqualified them for many commercial applications due to safety regulation. In some cases, the glass plates are too heavy to be used.

Plastic plate is advantageous over the glass and silicon wafers in terms of weight and design flexibility. In addition, an economic advantage for using plastic plate as containers, picture frames, craftworks, stamps collections, etc. is from their continuous manufacturing.

Organic/polymer based devices are rapidly gaining momentum as the technology of choice for optoelectronic and electric applications where low power consumption, low cost and superior ability to build on plastic substrates are desired. However, systematic studies demonstrate that organic/polymer based devices degrade when they are exposed to oxygen, water vapor or UV light. For example, substantial degradation in organic light-emitting diodes (OLEDs) and polymeric lighting-emitting diodes (PLEDs) occurs, due to the instabilities of the organic/polymer materials and/or their interfaces with the contact electrodes when subjected to moisture, oxygen and/or ozone. Additionally, the metals used for the electrodes in OLED devices are rapidly reactive to water and oxygen.

Raw plastic substrates are generally too permeable to moisture and oxygen to be used in packaging for organic/polymer based devices. For example, the oxygen and water permeabilities in a 12 µm thick PET film are ~1.5 ml/m$^2$/day and 1.5 g/m$^2$/day, respectively. Therefore, one ongoing research interest is focused on developing a flexible substrate or encapsulation layer with low water and oxygen diffusivities.

Papers are another class of materials with promise for use as thin film substrates. Since papers are typically made with fabric materials, additional coatings are typically need to provide the necessary barrier properties. Various methods and techniques have been devised for development of a coating layer or layers for protecting against oxygen, water, and ozone permeation.

In the food industry, co-extruded laminate films have became increasingly important and have recently been applied in the packaging of products such as fresh pasta, meats and cut vegetables to extend the self-life of the goods. Commercial multilayer films currently comprise a number of layers of different polymers. In most applications, the outer layer consist of cheap, water barrier polymers with good mechanical properties and the inner layer consist of more expensive materials, which offer good gas-barrier properties. However, the permeability of package films in food industry is not sufficient for the applications addressed in this invention.

For display applications, a hermetic encapsulation technique using a glass or metal lid attached by a bead of UV cured epoxy resin has been proposed to protect OLEDs/PLEDs from oxygen and water vapors (P. E. Burrows, V. Bulovic, S. R. Forrest, et al., Appl. Phys. Lett., 1994, 65, 2922). However, these types of seals are expensive to fabricate and require extensive labor to assemble. In addition, these seals are large and heavy so that they severely limit the application of the OLEDs/PLEDs. For thin and lightweight passivation of OLEDs/PLEDs, encapsulation methods based on dry processes have been proposed (K. Yamashita, et al., Appl. Phys. Lett., 2001, 34, 740; S. H. Kwon, et al., Appl. Phys. Lett., 2001, 79, 4450; M. S. Weaver, et al., Appl. Phys. Lett., 2002, 81, 2929; WO Patent, No. 02/063698; US patent, No. 2002125882; US patent, No. 2005/0227004; US. Patent, No. 2005/0239294; WO Patent, No. 98/01910; U.S. Pat. No. 6,873,101). B. Nilsson and P. Bailey disclosed a thin film packaging method comprising one or more thin dielectric layers (e.g., SiN$_4$) processed with PECVD at low temperature (U.S. Pat. No. 6,635,989).

Vitex System Inc. developed a thin package film in a multilayer structure termed Barix for encapsulating OLEDs (L. Moro, et al., SPIE, 2004, 5214, 83; US Patent Application Publication No. 2002/125822). The Barix developed by Vitex Systems Inc. includes deposition of Al$_2$O$_3$ layers, which are reactively sputtered onto the display via energetic plasma, in between polyacrylate layers deposited via flash evaporation for the monomer followed by UV curing. The entire process is carried out in a bulky integrated vacuum tool, so that process size is limited and cost is high.

It would be highly advantageous, therefore, to remedy the foregoing and other deficiencies inherent in the prior art.

Accordingly, it is an object of the present invention to provide new and improved multilayer films for packaging applications.

It is another object of the present invention to provide new and improved methods of manufacturing multilayer films for packaging applications.

Another object of the invention is to provide new and improved multilayer films that are easy to produce and install as packages.

Another object of the invention is to provide new and improved multilayer films that produce a high permeation barrier to water, oxygen and ozone.

Another object of the invention is to provide new and improved multilayer films that are solution-processed to simplify manufacturing.

SUMMARY OF THE INVENTION

The multilayer film disclosed in this invention is formed by solution process, following a treatment at a low temperature. The multilayer film is made with polymer/organic materials, functionalized inorganic materials, and composites including polymer/organic materials with functionalized inorganic materials termed polymeric/organic binders. The multilayer film is intended for package applications, and more specifically, for use as a package or package layer for electric and electronic devices, opto-electric devices, solar cells, biosensors, chemsensor, batteries or other types of electrochemical cells, craftworks, plastic containers, stamps collection, etc.

In multilayer films, the functionalized inorganic materials are inorganic compounds at least containing one of transition metals and alkaline metals including metals, metal oxides, complex metal oxides and ceramic nano-composites. In the multilayer films, the inorganic materials act as diffusion barriers to water and oxygen while polymeric/organic materials decouple defects in the oxide as well as acting as a binder to provide mechanical strength and processability. The inorganic compound can be in either stoichiometrically balanced or non-balanced form.

The advantages of the multilayer films as a permeation barrier of water, oxygen and ozone are: (1) all layers involved are solution-processed that can be easily integrated into manufacturing processes in either batch form, or in a roll-to-roll form; (2) all layers are processed at room temperature or temperatures below the melting point of the supporting substrate; (3) no vacuum deposition is involved; and (4) they are conformable and can be made in flexible form or onto substrate with predefined shapes. These advantages decrease dramatically the material and processes cost and make such multilayer films promising for many packaging applications.

Briefly, to achieve the desired objects of the instant invention in accordance with a preferred embodiment thereof, provided is a multilayer film formed by a solution process. The multilayer film includes a plurality of basic film structures positioned in contiguous overlying relationship to form a common multilayer film. Each of the plurality of basic film structures includes one of: a first two-layer structure with a first layer including one of a polymer material and an organic material and a second layer including a functionalized inorganic material; a second two-layer structure with a first layer including one of a polymer material and an organic material and a second layer including one of a polymer binder and an organic binder; and a three layer structure with a first layer including one of a polymer material and an organic material, a second layer including a functionalized inorganic material, and a third layer including one of a polymer binder and an organic binder; the combinations of above basic structures.

Generally, the multilayer film is formed one layer at a time. The materials of each layer are formed into a solution and the solution is coated/printed over a device to be encapsulated or over a previous layer, or over a supporting substrate. The coated/printed film is then annealed or cured at a temperature lower than the melting point of a supporting substrate or with a proper radiation source.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 2A, 2B and 2C illustrate enlarged simplified sectional views of three multilayer films with different structures for package applications in accordance with the present invention;

FIGS. 3A, 3B and 3C illustrate three enlarged simplified sectional views of multilayer films with different structures for package applications in accordance with the present invention;

DETAILED DESCRIPTION OF A PREFERRED EMBODIMENT

Figure 1:
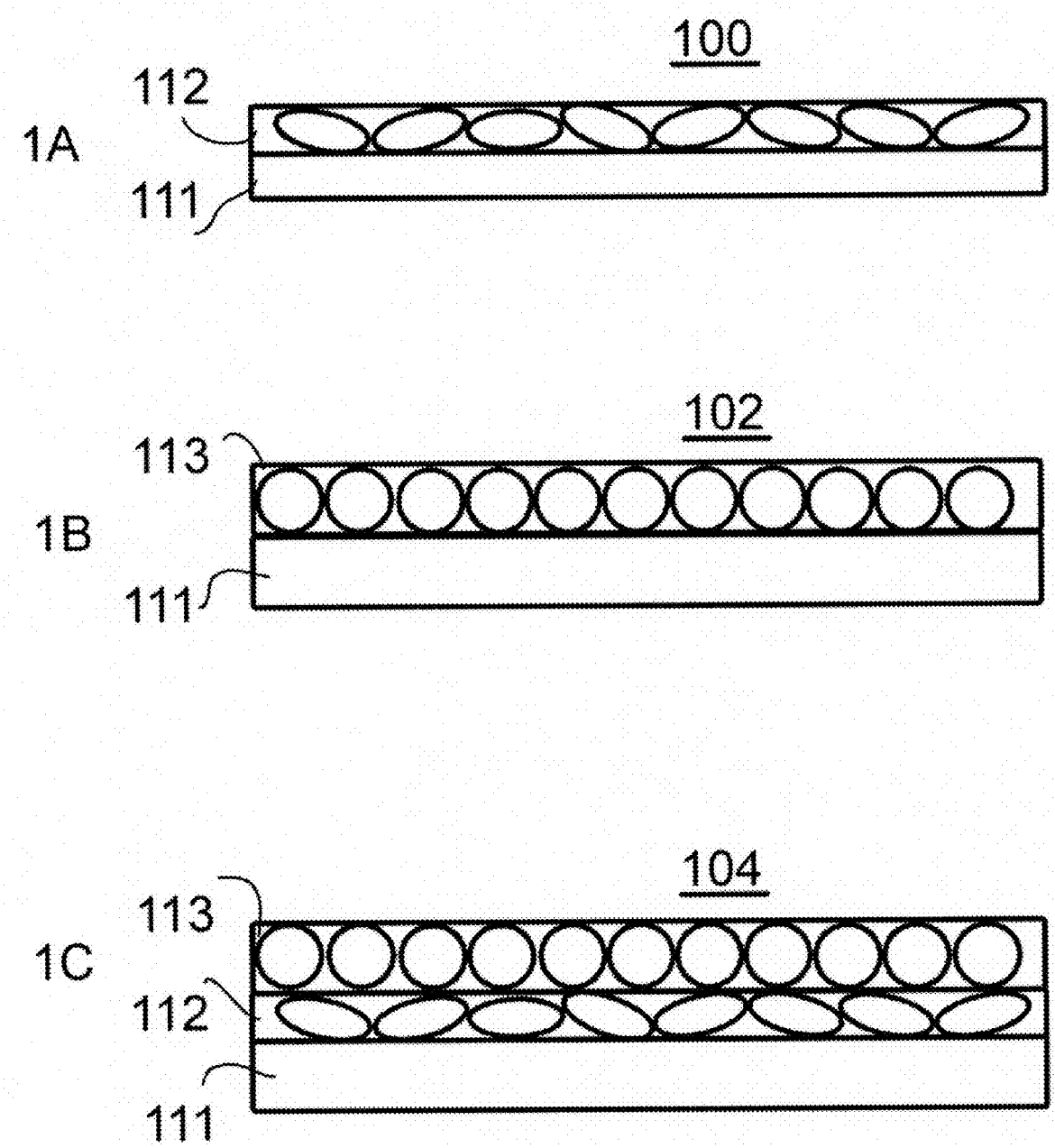
FIGS. 1A, 1B and 1C illustrate greatly enlarged simplified section views of three basic multilayer films formed of different materials in accordance with the present invention.
Figure 4:
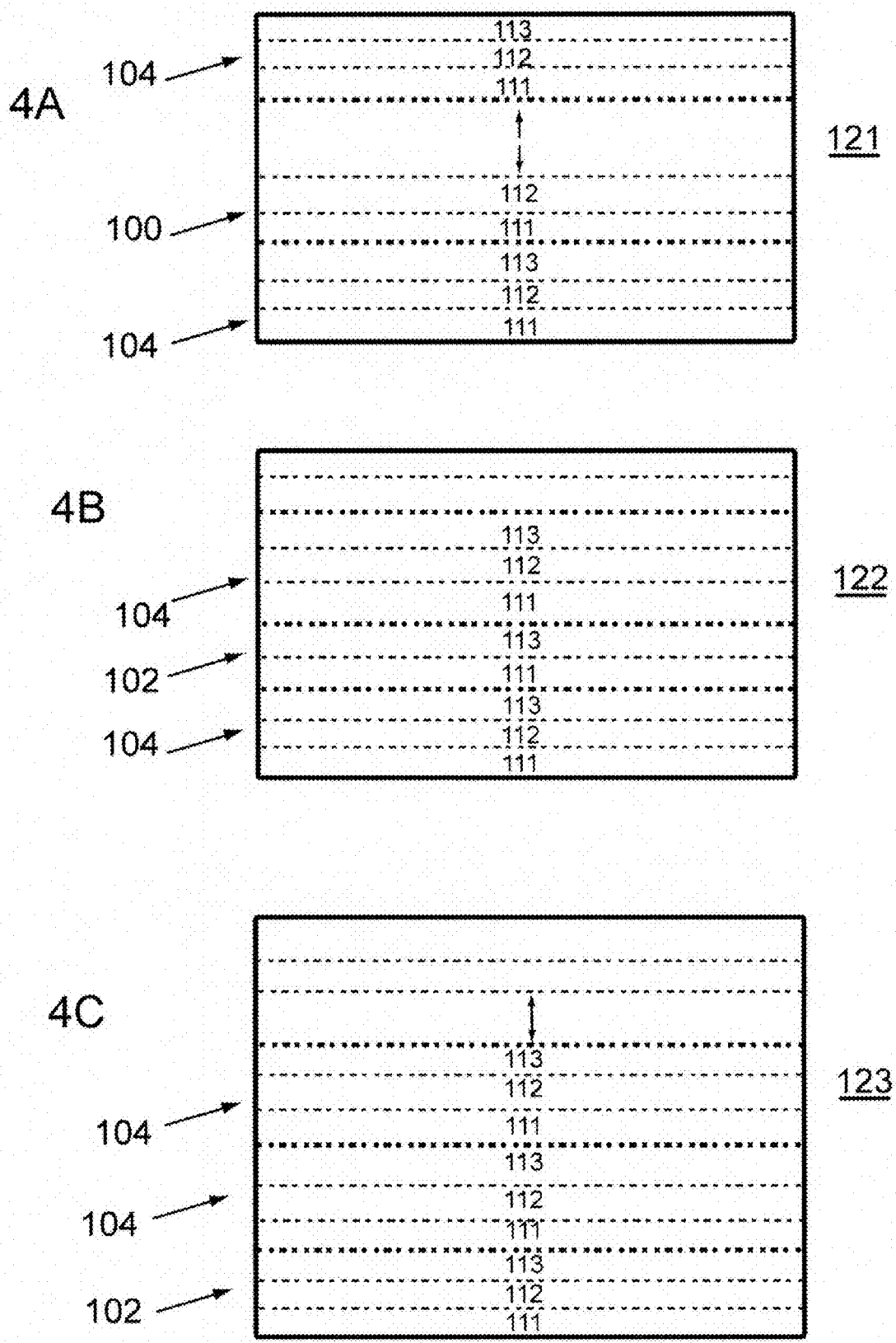
FIGS. 4A, 4B and 4C illustrate an additional three enlarged simplified sectional views of multilayer films with different structures for package applications in accordance with the present invention.
Figure 5:
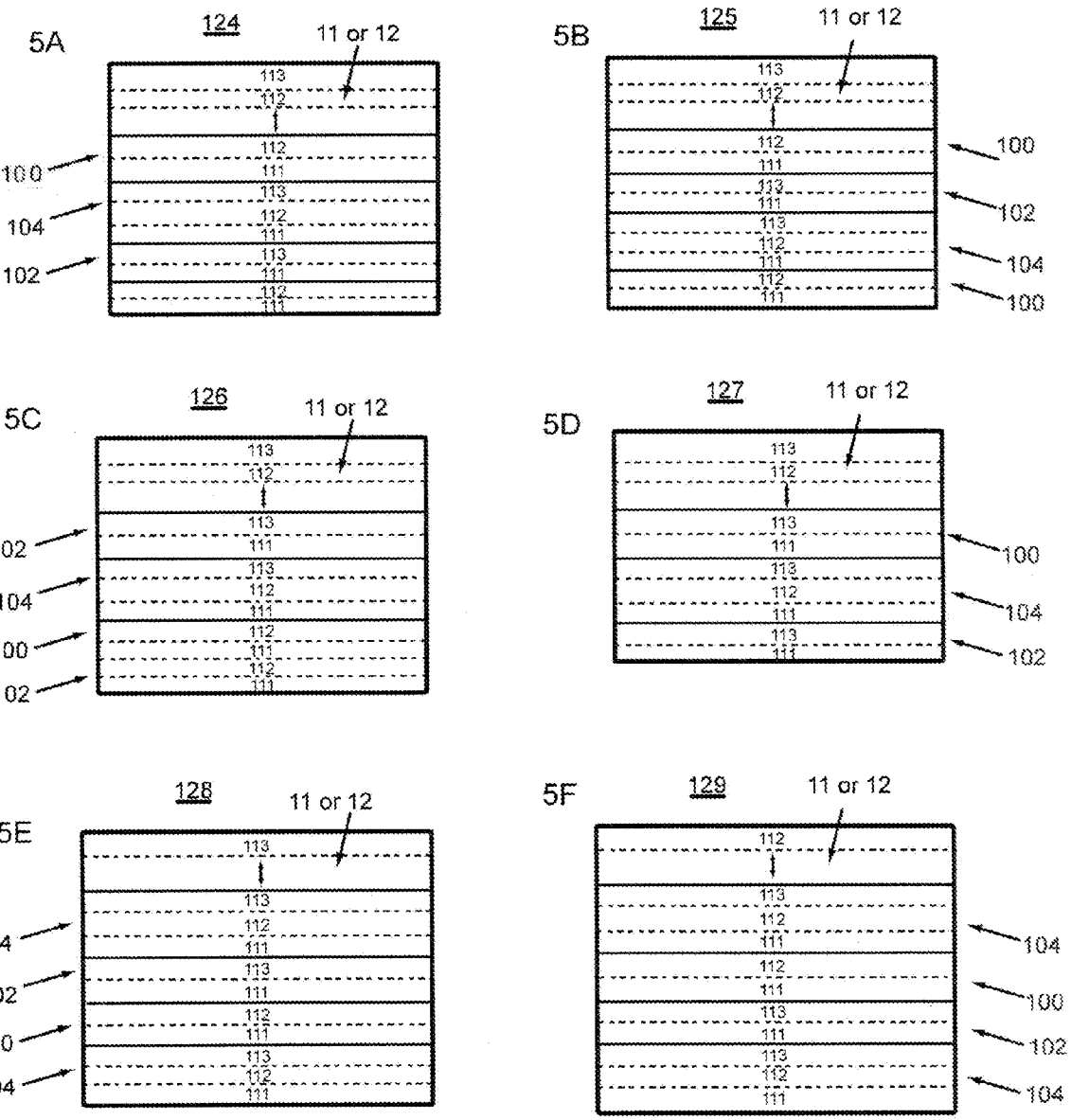
FIGS. 5A, 5B, 5C, 5D, 5E, and 5F illustrate other enlarged simplified sectional views of multilayer films with different structures for package applications in accordance with the present invention.

Before addressing details of embodiments described below, for purposes of clarity, some terms are described and defined herein below.

The term "low permeation rate" relating to water and/or oxygen and/or ozone is intended to mean that the permeability limit is smaller than 1 $g/m^2/day$ (for water) or 1 $ml/m^2/day$ (for $O_2$ and/or ozone) at room temperature and at pressure of 1 atmosphere.

The term "the coefficient of thermal expansion" (CTE) is intended to mean the fractional increase in length per unit rise in temperature. The exact definition varies, depending on whether it is specified at a precise temperature (true coefficient of thermal expansion) or over a temperature range (mean coefficient of thermal expansion). The former is related to the slope of the tangent to the length—temperature plot, while the latter is governed by the slope of the chord between two points on this curve. Considerable variation in the value of the CTE can occur according to the definition employed. The term "low CTE" is intended to mean that the CTE is in a range from $1\times10^{-4}K^{-1}$ to $1\times10^{-6}K^{-1}$. (i.e. meters/degrees Kelvin.)

The term "chemical resistance" is intended to mean that a multilayer film has resistive ability to withstand the presence of materials—such as acids, bases, water, salt water, and fuels—that can deteriorate an insulation.

The terms "solution" or "semi-solution" are intended to mean a chemical composite comprising a liquid component mixed with a solid component. The solution or semi-solution could be: in very homogenously "so-called true solution", suspension, emulsion or the like; in an in-homogenous composite called "paste", like UV curable single phase epoxy; cross-linked under UV or heat to form a film; or in a precursor which is volatile and thermally stable to allow forming a film by atomic layer deposition, like a $ZrCl_4$ solution for forming a $ZrO_4$ film.

The term "coating" or "printing" is intended to mean any method or technology that uses a solution or semi-solution to form a layer on a supporting substrate, surface, or prior formed layer. The film can be either continuous or non-continuous in a form of pre-defined patterns. More details on coating/printing technologies can be found in "*Handbook of Coating Technology*" (edited by Arther A. Tracton and published in 2006 by CRC Taylor & Francis Group) and incorporated herein by reference.

The term "a composite comprising both polymer/organic materials and functionalized inorganic materials" is intended to mean any polymer/organic fluids including conjugated and non-conjugated polymers and co-polymers, oligomers, dendrimers and small molecules, physically mixed and/or chemically bonded with functionalized inorganic materials.

The term "functionalized inorganic materials" is intended to mean that inorganic materials were functionalized during its synthetic process. These functionalized materials have bulk physical and chemical properties and also have certain novel physical and chemical properties, for example, by tuning molecular structures and the size of molecular formation. More details on functionalized inorganic materials can be found in the "*Handbook of inorganic-organic materials*" (edited by Hari Singh Nalwa published in 2003 by American Scientific Publishing) and incorporated herein by reference.

The term "drying" is intended to describe the film forming process from solution to solid or semi-solid at a pre-defined environmental condition.

The term "annealing" and "curing" are intended to mean that a treatment to a film (in either solid or semi-solid form) with a pre-defined heating cycle at certain temperature or with a radiation source at pre-defined wavelength profile in either continue-wave form or pre-defined temporary profile for a defined time length.

The term "opto-electric devices" is intended to mean devices with either optical-to-electrical or electrical-to-optical functions.

The term "electric device" and "electronic devices" are intended to refer to any devices know in electric and electronic fields no matter in passive or active form: examples of passive devices include resisters, conductors, capacitors, and inductors; examples of active devices include transistors, diodes, integrated circuits, etc.).

The term "electrochemical devices" and "batteries" are intended to mean any devices made with electrochemical functions: examples of electrochemical devices include rechargeable or non-rechargeable batteries, and fuel cells.

The terms "biosensors" and/or "chemsensors" are intended to mean any electric, electronic, opto-electronic devices used for bimolecular or chemical detection applications.

The term "transparent" is intended to mean that the multilayer films have optical transmittance over 80% in the visible spectral range or in a spectral range of interest.

The term "semi-transparent" is intended to mean that the multilayer films have optical transmittance between 80%-1% in the visible spectral range or in a spectral range of interest.

The term "opaque" is intended to mean the multilayer films have optical transmittance less than 1% in the visible spectral range or in a spectral range of interest.

The following descriptions are of exemplary embodiments of the invention and the inventors' conceptions of the best mode and are not intended to limit the scope, applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

Referring to FIGS. 1A, 1B, and 1C, three different types of "building block" film structures are illustrated. Turning to FIG. 1A, a two-layer film structure 100 is illustrated that includes one layer 111 formed from a solution containing polymers or organic materials and another layer 112 formed from functionalized inorganic materials. Referring to FIG. 1B, another two-layer film structure 102 is illustrated in which one layer 111 is formed from a solution containing polymers or organic materials and another layer 113 is formed from polymer or organic binders. Referring additionally to FIG. 1C, a three-layer film structure 104 is illustrated in which one layer 111 is formed from a solution containing polymers or organic materials, another layer 112 is formed from functionalized inorganic materials, and a third layer 113 is formed from polymer binders or organic binders. In all three types of films 100, 102, and 104, curing/annealing is performed on each single layer at a temperature less than the melting point of a supporting substrate (not shown) after fabrication of an individual layer. Also, while the various layers are described and later claimed in a specific order for convenience in understanding, it will be recognized by those skilled in the art that variations in order may be introduced in specific applications.

FIGS. 2A through 5F illustrate examples of different types of multilayer films that can be formed by repeating or combining the basic film structures or building blocks shown in FIGS. 1A, 1B and 1C. Generally, a multilayer film includes a plurality of basic film structures 100, 102, and/or 104. A multilayer film 115, illustrated in FIG. 2A, includes multiple layers of basic film structure 100 from FIG. 1A. A multilayer film 116, illustrated in FIG. 2B, includes multiple and alternating layers of basic film structures 100 and 102 from FIGS. 1A and 1B. A multilayer film 117, illustrated in FIG. 2C, includes multiple and alternating layers of basic film structures 100 and 104 from FIGS. 1A and 1C.

A multilayer film 118, illustrated in FIG. 3A, includes multiple layers of basic film structure 102 from FIG. 1B. A multilayer film 119, illustrated in FIG. 3B, includes multiple and alternating layers of basic film structures 102 and 100 from FIGS. 1B and 1A (i.e. the reverse of multilayer film 116). A multilayer film 120, illustrated in FIG. 3C, includes multiple and alternating layers of basic film structures 102 and 104 from FIGS. 1B and 1C.

A multilayer film 121, illustrated in FIG. 4A, includes multiple and alternating layers of basic film structures 104 and 100 from FIGS. 1C and 1A (i.e. the reverse of multilayer film 117). A multilayer film 122, illustrated in FIG. 4B, includes multiple and alternating layers of basic film structures 104 and 102 from FIGS. 1C and 1B (i.e. the reverse of multilayer film 120). A multilayer film 123, illustrated in FIG. 4C, includes multiple layers of basic film structure 104 from FIG. 1C.

A multilayer film 124, illustrated in FIG. 5A, includes multiple and alternating layers of basic film structures 100, 102 and 104 from FIGS. 1A, 1B and 1C. In FIGS. 5B through 5F, multilayer films 125 through 129 are illustrated, respectively, in which the three basic film structures 100, 102, and 104 are alternated differently to produce different final multilayer films. It will be clear to those skilled in the art from the above disclosure that a large variety of different multilayer films, in addition to those illustrated, can be formed from the basic film structures disclosed.

Figure 6:
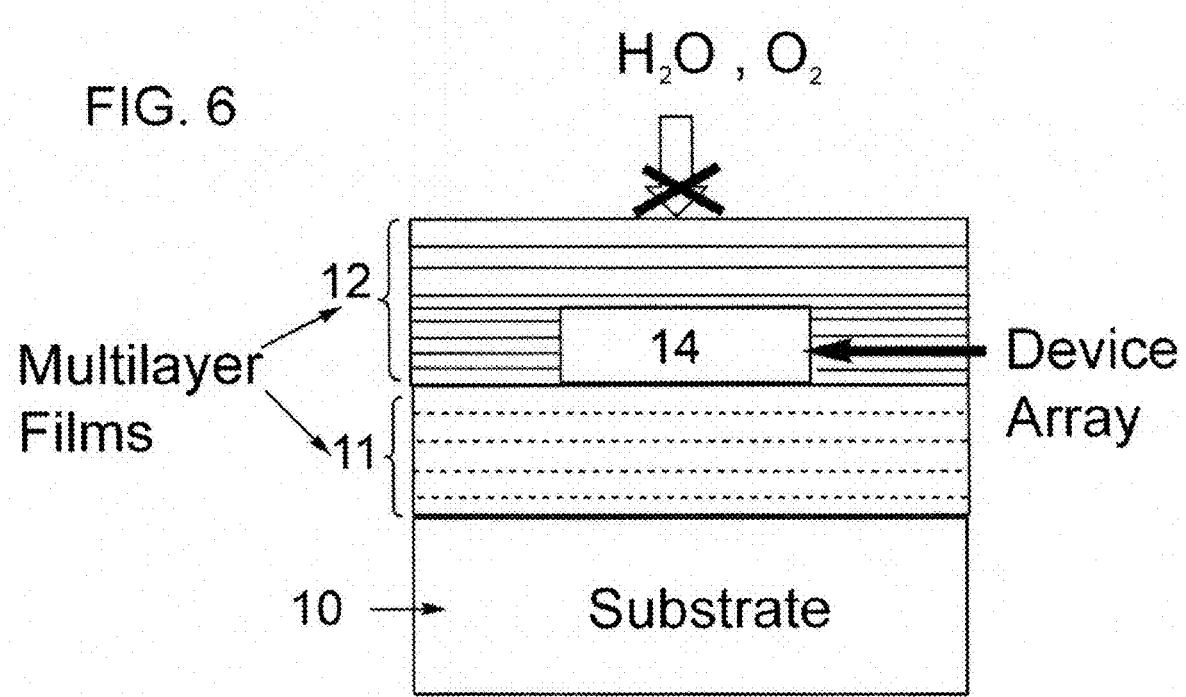
FIG. 6 is a simplified cross-sectional view illustrating multilayer films encapsulating an opto-electric device array.

Turning now to FIG. 6, a simplified cross-sectional view is illustrated of a multilayer film encapsulated opto-electric device array 14, in accordance with the present invention. The multilayer films 11 and 12, which include any of the films 115-129 shown in FIGS. 2, 3, 4 and 5 or other similar combinations, are deposited on a substrate 10 and/or on device array 14 to protect the device array from water, oxygen and ozone. It will be understood that substrate 10 can be wholly encapsulated, partially encapsulated, encapsulated on both sides and the like. When substrate 10 is formed of plastic materials and the like generally too permeable to moisture and oxygen, multilayer 11 is deposited on the surface of substrate 10 before device array 14 is mounted thereon. Multilayer 12 is then formed over and around device array 14 so that device array 14 is completely surrounded and protected from water, oxygen and ozone.

In a preferred embodiment, substrate 10 is made of a material selected from the group consisting of metals, metal alloys, glasses, ceramic materials, crystalline wafer. In this case, substrate 10 is impermeable to water, oxygen and ozone and device array 14 can be mounted in a normal process (e.g. an integrated circuit mounted and connected to metallization on the surface). Multilayer 11 is thus unnecessary.

In yet another preferred embodiment, substrate 10 is made of plastic sheets or paper sheets (such as Mylar, PET (polyethylen terephthalate), PEN, PAN, PC or polyimide), or paper or fiber enriched organic sheets. In this case, substrate 10 is too permeable to water, oxygen and ozone that multilayer 11 becomes necessary. In some cases in which the thickness of the substrate is thin, layer 11 could be coated on both sides of substrate 10 that both permeation and mechanic strength are warranted.

Multilayer 12 is then formed over and around device array 14 and in contact with the surface of substrate 10 so that device array 14 is completely surrounded and protected from water, oxygen and ozone. Since layers 11 and/or 12 are formed from solutions, they are conformal to the topology of the substrate or devices so that no air gaps are left in between. Due to the conformal nature of solution process, the multilayer 11 also improves the surface smoothness that a low quality and low cost substrate 10 can be used that those used in prior-arts.

Generally, device array 14 includes one or more electronic devices, opto-electric devices, thin film devices made with inorganic semiconductors, polymer/organic semiconductors and/or the combinations of the above. Device array 14 can be made by a solution process, or by vacuum-deposition, or other techniques known in the device field. Device array 14 could also or alternatively include an electrochemical cell array such as a non-rechargeable or rechargeable battery array or a biosensor cell array or chemsensor cell array.

The polymer materials in any of the basic structures 100, 102, or 104 include any conjugated polymers and non-conjugated polymers, oligomers and dendrimers, which includes PVP, PPV and their derivatives, PFO and its derivatives, polythiophone and its derivatives, PE, PMMA, polystyrene, PVK, PVA, polycarbonate, BCB, Silk and polyhedral oligomeric silsequioxanes (POSS) and its derivatives. The organic materials in any of the basic structures 100, 102, or 104 include any soluble small molecules. Examples include the molecules with function groups of triethylopropane triacrylate, tri propylene glycol diacrylate, penthaerithritol triacrylate, trimethylolpropane ethoxylate triacrylate, methyl methacrylate, methacrylate, tri(propylene glycol) glycerolate diacrylate and vinylacrylate. The organic materials in any of the basic structures 100, 102, or 104 include fullerene molecules made with carbon network in either ball or tube forms. The soluble organic materials in any of the basic structures 100, 102, or 104 also include any of the organic materials known as "epoxy" in the corresponding fields.

The functionalized inorganic materials in any of the basic structures 100, 102, or 104 include materials selected from the compounds and elements containing any of the elements from the groups from IIA to VIIA, IB to VIIIB, and VIII including, for example, any conductor pastes. The functionalized inorganic materials can also include at least the metal oxides like $TiO_2$, $Ta_2O_5$, $Al_2O_3$, $In_2O_3$, $SnO_2$, $ZrO_4$, MgO, BaO, CuO, $Cu_2O$ and the like; metal complex oxides like $YBaCuO_3$, $BaTiO_3$ and the like; and ceramic nano-composites and the like. The functionalized inorganic materials can also include at least the metal oxides and the metal complex oxides with non-stoichiometric ratios between metal and oxygen such as $TiO_{2-\delta}$, $Ta_2O_{5-\delta}$, $Al_2O_{3-\delta}$, $In_2O_{3-\delta}$, $SnO_{2-\delta}$, $ZrO_{4-\delta}$, $CuO_{1-\delta}$, $YBaCuO_{3-\delta}$, $BaTiO_{3-\delta}$ and the like or between metals involved such as In-Tin-Oxide. Improvement in permeability properties is often achieved in such inorganic materials with stoichiometric non-balance (such as with oxygen deficient) or with metals with variable valance, or in metal complex oxides with mix-valance between metals. These functionalized metal oxides, complex metal oxide and ceramic nano-composites are synthesized by a sol-gel process. The conductor pastes include any metal pastes such as Ag, Au, Co, Ni, and metal oxide pastes including ITO (indium-tin-oxide), ZnO, CuO, IZO (indium-zinc-oxide), AZO (aluminum-zinc-oxide). The functionalized inorganic materials can also include silicon-based compounds like SiN, aerosol, silanes, silicones, polyhedral oligomeric silsesquioxanes and liquid glass.

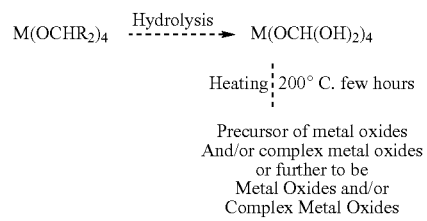

Precursor of metal oxides
And/or complex metal oxides
or further to be
Metal Oxides and/or
Complex Metal Oxides The linking metals, designated M in the above process, which include; Cu, Ni, Co, Fe and alloys such as CoNi, FeCo, metal oxides such as $TiO_2$, $VO_2$, $Ta_2O_5$, $Al_2O_3$, $In_2O_3$, $SnO_2$, $ZrO_4$ and the like; metal complex oxides such as $YBaCuO_3$, $BaTiO_3$ and the like; and ceramic nanocomposites and the like are converted from organmetallic compounds through photochemical metal/metal oxide organic deposition (Ross H. Hill, et al., J. Photochem. Photbiol. A. Chem., 1994, 81, 183; J. Am. Chem. Soc., 1996, 118, 237).

Other mechanisms for forming the metals and metal oxides and complex metal oxides are illustrated, for example, as follows:

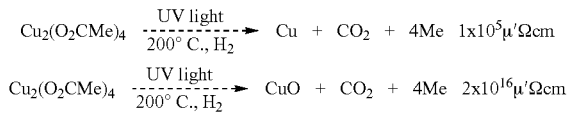

$$Cu_2(O_2CMe)_4 \xrightarrow[200°C., H_2]{UV\ light} Cu + CO_2 + 4Me \quad 1 \times 10^5 \mu'\Omega cm$$

$$Cu_2(O_2CMe)_4 \xrightarrow[200°C., H_2]{UV\ light} CuO + CO_2 + 4Me \quad 2 \times 10^{16} \mu'\Omega cm$$

The composites comprising polymeric/organic materials and functionalized inorganic materials termed polymer/organic binders are any of the above mentioned polymeric/organic molecules either physically mixed with or chemically bonded with any of the above mentioned functionalized inorganic materials. These composites have a good solubility in both polar and non-polar solvents.

Referring to the films illustrated in FIGS. 1 through 5, the manufacturing method for making individual layers in the multilayer films is a solution process. In the layers shown in from FIGS. 1 through 5, different optical parameters could be adopted. Optically transparent, semi-transparent, or opaque, or a desired optically transparent characteristic can be arranged following the design of a thin film optical stack known to experts in the art. Alternatively, in the multilayer films shown in FIGS. 1 through 5, a desired optical reflectance could also be arranged by following thin film optical design known to experts in the art. In the layers shown in FIGS. 1 through 5, the thickness of the multilayer films ranged from a few hundred Angstrom to few micrometers, following thin film optical and application designs known to experts in the art.

Figure 7:
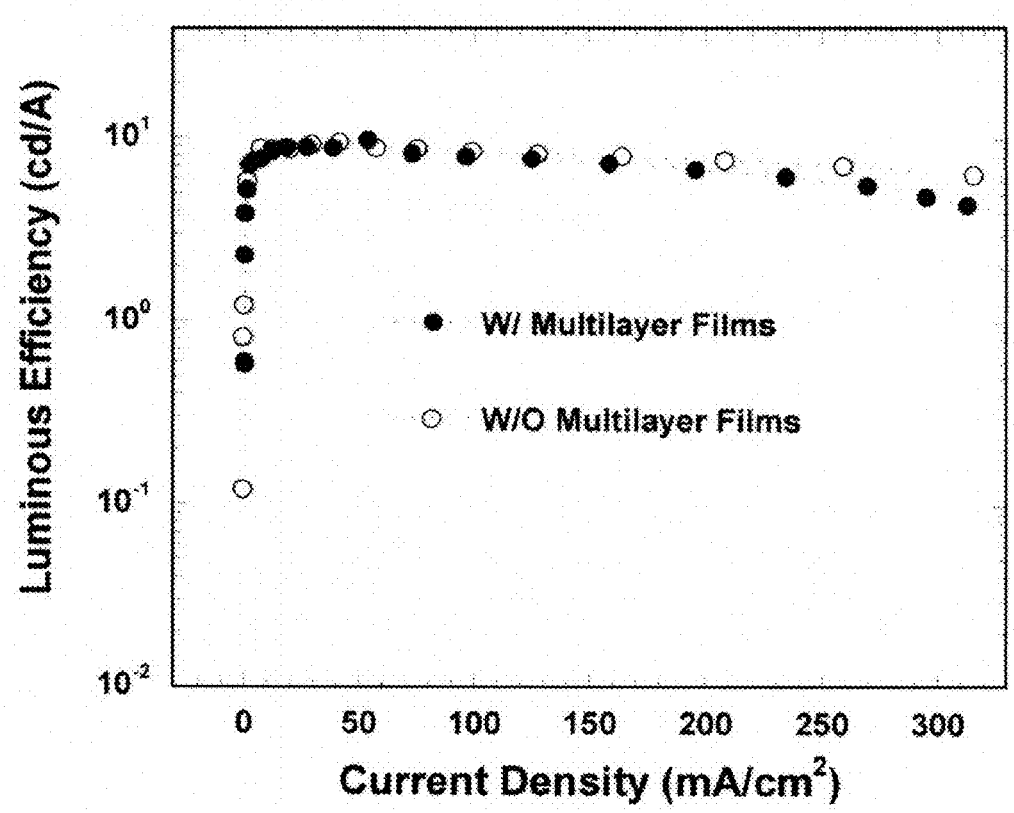
FIG. 7 shows the luminous efficiency (cd/A)—current density ($mA/cm^2$) characteristics of PLED test pixels with and without encapsulated multilayer films, measured after fabrication of the PLED pixel.

To demonstrate the novelty and validity of this invention, PLED devices were fabricated and were used to quantify the encapsulation films disclosed in this invention. For example, FIG. 7 shows the luminous efficiency (cd/A)—current density (mA/cm$^2$) characteristics of two PLED test pixels with and without encapsulated multilayer films measured after fabricating PLED pixels and forming the encapsulated multilayer films. The data illustrated clearly that the PLED pixels with and without encapsulated multilayer films have the same luminous efficiencies at low and high current densities. These results demonstrated that the formation of the multilayer film as an encapsulation layer for PLEDs did not result in any changes in initial performance of the PLEDs.

Since PLEDs/OLEDs require the most rigorous package to maintain sufficient shelf lifetime, they are, in fact, great tools to be used to assess permeability of a package material. PLED devices were thus used here to evaluate the package properties of the film stacks disclosed in this invention. Both low and high current densities were applied to the PLEDs test pixels with and without encapsulating multilayer films. We found that the luminous efficiencies in PLEDs without an encapsulating multilayer film decreased dramatically with storage time. This demonstrated that the encapsulating multilayer film does increase the storage life of the PLEDs. A PLEDs testing pixel without encapsulating multilayer films decayed to 50% of its initial luminous efficiency in around 70 hours driving at both 1 mA and 5 mA. Driven for 70 hours at both 1 mA and 5 mA, a PLEDs testing pixel encapsulated with multilayer package films only decayed approximately 20% of the initial luminous efficiency. Driven for 150 hours at both 1 mA and 5 mA, a PLEDs testing pixel with multilayer films decayed approximately 30% of the initial luminous efficiency.

In addition, there was no dark spot growth observed in the PLEDs test pixel with an encapsulating multilayer film. Close monitoring the encapsulated PLEDs, no new dark spots formed as the devices aged, but the ones which were present grew larger. The initial formation of dark spots is believed to be due to unintentional exposure of PLEDs to particles, moisture, and oxygen immediately prior to encapsulation with a multilayer film. The observed dark spots' growth in the PLEDs without an encapsulated multilayer film is attributed to exposure of the devices to oxygen and moisture in air.

Polymer based photovoltaic cells (polymer PVs) with a configuration of ITO/PEDOT/P3HT:CdSe/Al (where: PEDOT is poly(3,4-ethylenedioxythiophene); P3HT is poly-(3-hexylthiophene)) was also used here to evaluate the package properties of the film stacks disclosed in this invention. The above photovoltaic test pixel (cells) with and without an encapsulating multilayer film was fabricated and the shelf stability was studied. It was found that the power conversion efficiencies in polymer PVs without an encapsulating multilayer film decreased dramatically with storage time. On the other hand, the power conversion efficiencies in polymer PVs with an encapsulating multilayer film remained the same during the test period. Other polymer PVs fabricated with polymer with $C_{60}$ and/or its derivatives, and polymer with another different polymer were also investigated. Similar results were observed. These results demonstrated that the encapsulating multilayer film can be used for packaging photovoltaic cells.

Encapsulation of Al overcoating or over-covering Ba films was also used as a test to evaluate the permeation rate of water and oxygen. This is based on the corrosion of thin Ba films. The Ba film, as deposited in vacuum and encapsulated by the barrier film, is initially a metallic layer. By reacting with water and oxygen permeating through a leaking barrier, it is progressively transformed into a transparent Ba hydroxide film. By measuring the change in transmission of the film as a function of aging time, it is possible to calculate the thickness of Ba reacted and therefore the amount of water that penetrated through the barrier.

Figure 8:
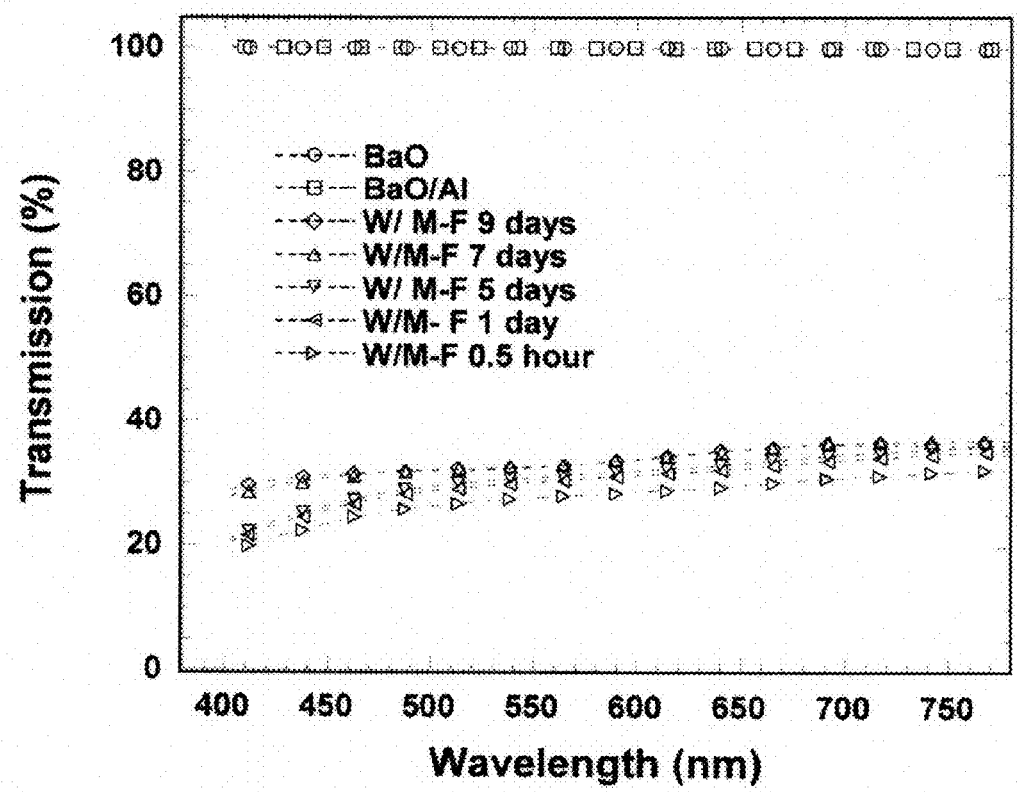
FIG. 8 is a graphical representation of change in transmittance of Ba over-covered with Al, with multilayer films, over time.
Figure 9:
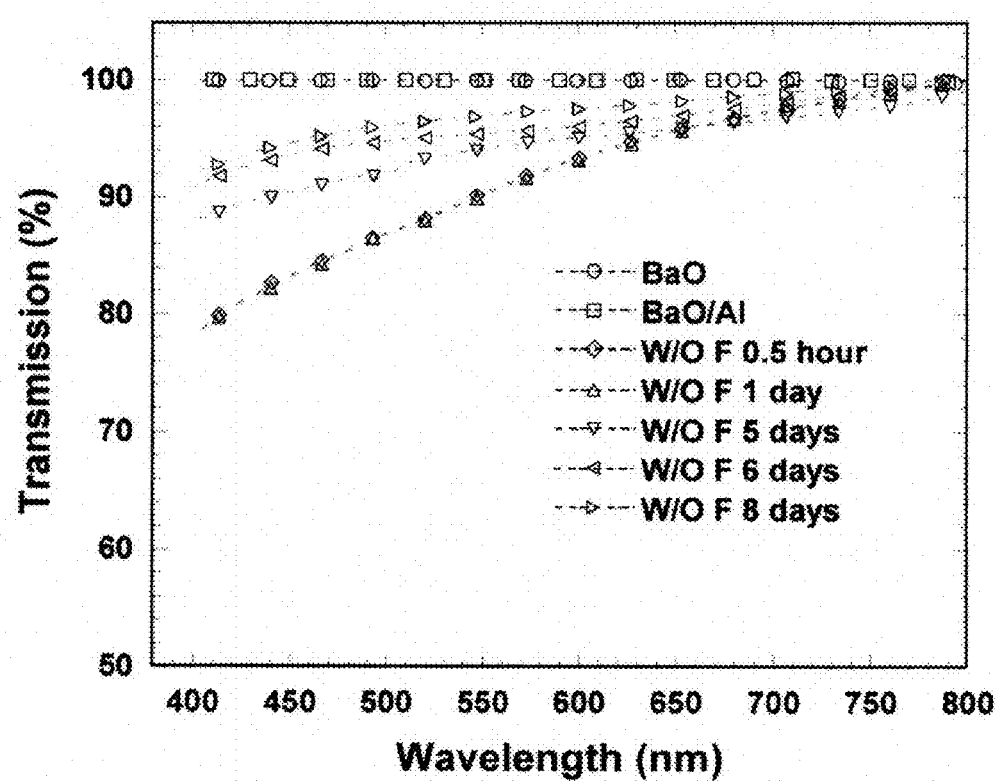
FIG. 9 is a graphical representation of change in transmittance of the Ba over-covered with Al, without multilayer films, over time.

Referring to FIGS. 8 and 9, change, over time in optical transmittance of a layer of Ba over-covered by a thin Al layer with and without multilayer films is graphically represented. It is clear that the Ba/Al films without encapsulation by multilayer films have higher transmittance than those encapsulated with multilayer films. The increase in optical transmission is due to the chemical reaction of metallic Ba atoms with $O_2$ and $H_2O$ reaching them and transforming them into BaO or Ba hydroxide.

By calculating the relative change in transmission at 600 nm, the permeation rate of water and oxygen can be estimated. The change in transmission is defined as follows:

The change in transmission(%)=(($T_1-T_0$)/$T_0$)(%)

Where: $T_i$ and $T_0$ are the values of transmission respectively at the aging time and at the initial acquisition after coating with multilayer films.

Figure 10:
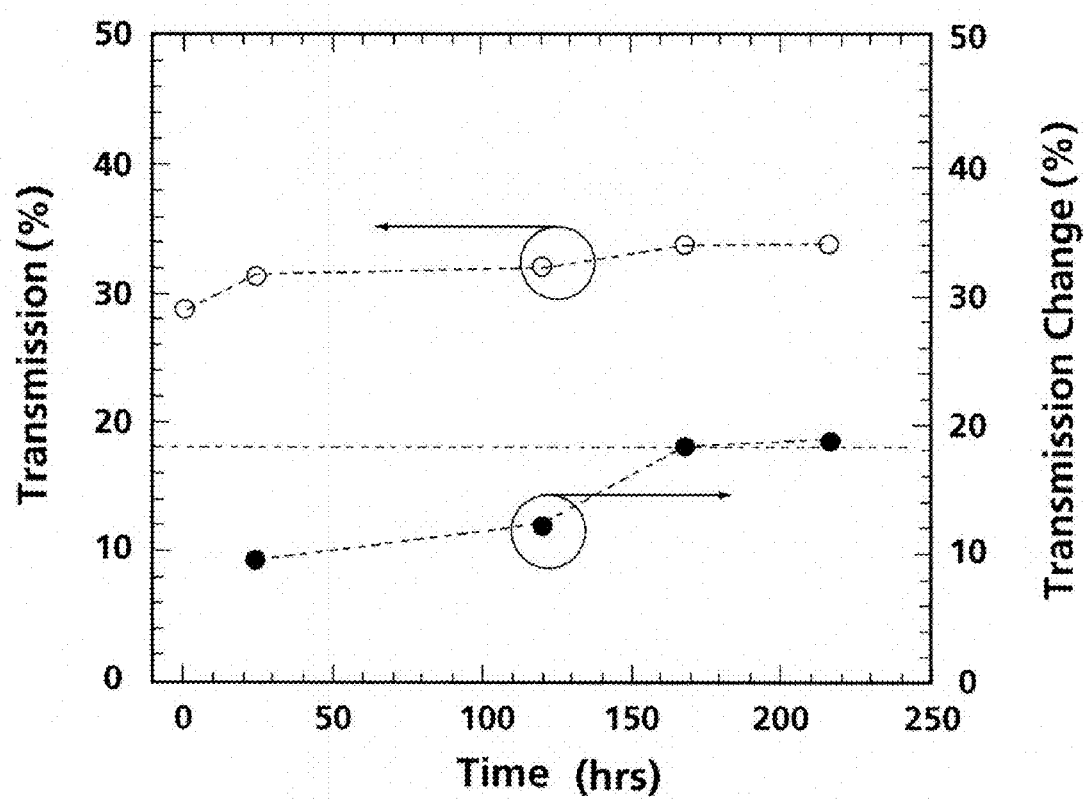
FIG. 10 is a graphical representation of the transmission values (left) and the relative change in transmission (right) as a function of aging time for the Ba over-covered with Al, with multilayer films.

Referring to FIG. 10, the transmission values (left) and the relative change in transmission (right) are illustrated as a function of time for a reference sample. A value ranged from 15% to 20% is equivalent to ~$10^{-5}$ g/m$^2$/day of water permeated through the multilayer films used in the test [G. Nisato, M. Kuilder et al., SID, 2003, 88]. The permeability can be further reduced by increasing the number of multilayer films in a stack.

In order to investigate the CTE of the multilayer film, a multilayer film similar to that in Example 3 below was formed on a glass substrate and peeled off to form a free-standing film. The film was placed onto a hot plate, and the dimension changes vs temperature was recorded. The CTE was extracted from the test results. The coefficient of thermal expansion of the multilayer film shown in Example 3 is estimated to be approximately $5 \times 10^{-5} K^{-1}$, substantially reduced from that in pure organic films with similar thickness.

Other multilayer films, shown in FIGS. 2 through 5, were also investigated and the CTE ranged from $1 \times 10^{-4} K^{-1}$ to $1 \times 10^{-6} K^{-1}$. These results demonstrated that multilayer films shown in FIGS. 2 through 5 have improved CTE.

Figure 11:
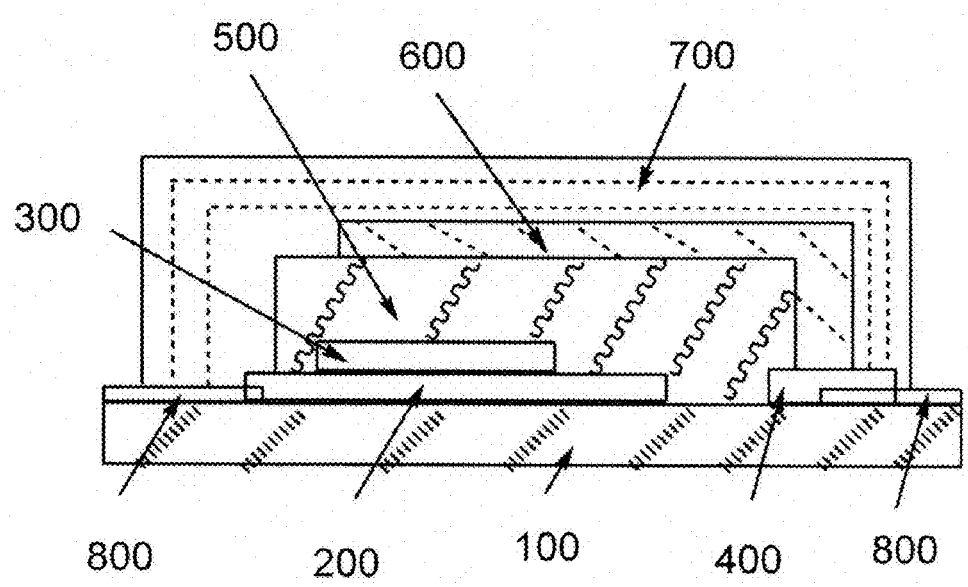
FIG. 11 is a simplified side view illustrating multilayer films encapsulating a battery in accordance with the present invention.

Referring to FIG. 11, a coating layer 700 is deposited on a substrate 100 so as to surround and encapsulate the surface of a rechargeable, thin-film battery. The battery includes an electrolytic layer 500, a cathode current collector 200 disposed on the upper surface of substrate 100 and connected to a cathode electrode 300 contacting one side of layer 500, an anode current collector 600 contacting the opposite side of layer 500 and a metallic contact layer 400 positioned on substrate 100. Bonded contacts 800 provide external connections to the battery. Stable batter operation was observed. This result demonstrated that the encapsulating multilayer film disclosed in this invention can be used for packaging batteries or other electrochemical devices.

Preferred manufacturing examples of multilayer films according to the present invention will be described now in more detail in the examples set forth below.

EXAMPLES

Example 1

In order to form a multilayer film as shown in FIGS. 2-5 for package applications, a PMMA solution was spin-coated on a plastic substrate and then annealed at a temperature of 120° C. for 30 minutes to form an approximately 200 nm layer, similar to layer 111 in FIG. 1A. A $Ta_2O_5$ precursor solution was formed on top of the PMMA layer and then annealed at a temperature less than 150° C. for 30 minutes to form an approximately 200 nm layer, similar to layer 112 in FIG. 1A. Additional layers similar to layers 111 and 112 were sequentially formed from PMMA solution and $Ta_2O_5$ precursor solution, followed with annealing/curing treatment at temperature less than 150° C. for 30 minutes.

Optical transmission of this multilayer film is greater than 90%.

This example was repeated with different thicknesses and annealing/curing treatments at different temperatures for the individual layers. Dip-coating, bar-coating, slot coating and spray coating were also used for coating films. Similar film qualities and results were observed.

This experiment demonstrates that multilayer films formed by solution process from polymer and inorganic materials can be used for package applications.

Example 2

In order to form a multilayer film similar to that shown in FIG. 1B and FIGS. 2-5 for package applications, a PMMA solution was spin-coated on a plastic substrate and then annealed at a temperature of 120° C. for 30 minutes to form an approximately 200 nm layer, similar to layer 111 in FIG. 1B. A solution comprising PVA with functionalized $TiO_2$ was sequentially formed on top of the PMMA layer and then annealed at a temperature less than 150° C. for 30 minutes to form an approximately 300 nm layer, similar to layer 113 in FIG. 1B. A PMMA solution and a solution comprising PVA with functionalized $TiO_2$ were sequentially formed thereon as additional layers similar to layers 11 and 113, respectively, and followed the annealing/curing at a temperature less than 150° C. for 30 minutes.

This example was repeated with different thicknesses and annealing/curing treatments at different temperatures for individually layers. Dip-coating, bar-coating, slot coating and spray coating were also used for coating the films. Similar film qualities and results were observed.

This experiment demonstrates that multilayer films formed by solution process from a polymer and a polymer binder (comprising polymer and functionalized inorganic materials) can be used for package applications.

Example 3

In order to form a multilayer film similar to that shown in FIGS. 1C and 2-5 for package applications, a PMMA solution was spin-coated on a plastic substrate and then annealed at a temperature of 120° C. for 30 minutes to form an approximately 200 nm layer, similar to layer 111 of FIG. 1C. $Ta_2O_5$ precursor solution was formed on top of the PMMA layer and then annealed at a temperature less than 150° C. for 30 minutes to form an approximately 200 nm thick layer, similar to layer 112 in FIG. 1C. A solution comprising PVA with functionalized $TiO_2$ was sequentially formed thereon as a third layer (~200 nm thick) followed with an annealing/curing treatment at a temperature less than 150° C. for 30 minutes, to form a layer similar to layer 113 of FIG. 1C. Other layers, similar to layers 111, 112, and 113 were formed from PMMA solution, $Ta_2O_5$ precursor solution and a solution comprising PVA with functionalized $TiO_2$ followed with annealing/curing treatment, respectively.

The optical transmission of this multilayer film is approximately 50%.

This example was repeated with different thickness and annealing/curing treatments at different temperatures for individual layers. Dip-coating, bar-coating, slot coating and spray coating were also used for coating the films. Similar film qualities and results were observed.

This experiment demonstrates that multilayer films formed by solution process from polymer, functionalized inorganic materials and the composite comprising polymer and functionalized inorganic materials, termed polymer binders, can be used for package applications.

Example 4

In order to form a multilayer film similar to that shown in FIG. 6 for encapsulation of polymer/organic based devices, the multilayer films described in Example 3 were formed either on a plastic substrate or on top of polymer/organic based devices.

This experiment demonstrates that multilayer films can be used for package applications to encapsulate polymer/organic based devices.

Example 5

As described in Examples 1, 2 and 3 above, a PMMA was prepared by dissolving 80 mg of PMMA into 1 ml of chlorobeneze, and then a film was formed by the spin-coating process followed by an annealing/curing treatment. The individual layers of the multilayer film were also formed by replacing PMMA with any of a monomer, a polymerization initiator, a polymer, an oligomer, a drendrimer, and soluble small molecules prepared by wet processing followed by a low temperature annealing/curing treatment. The multilayer film was formed in direct contact with the substrate and/or any of the devices.

As described above, these organic materials are any of conjugated polymers and non-conjugated polymers, oligomers and dendrimers, which includes PVP, PPV and their derivatives, PFO and its derivatives, polythiophone and its derivatives, PE, PMMA, polystyrene, PVK, PVA, polycarbonate, BCB, Silk and polyhedral oligomeric silsequioxanes (POSS) and its derivatives. The organic materials are the soluble small molecules. Examples include the molecules with function groups of triethylopropane triacrylate, tri propylene glycol diacrylate, penthaerithritol triacrylate, trimethylolpropane ethoxylate triacrylate, methyl methacrylate, methacrylate, tri(propylene glycol) glycerolate diacrylate and vinylacrylate.

Example 6

A layer of $Ta_2O_5$ precursor was prepared by sol-gel-based the spin casting or spin coating approach. The basic mechanism was produced from a solution precursor of the $Ta_2O_5$ with the formation of a gel network by two simultaneous processes: hydrolysis and policondensation, which is shown in the following:

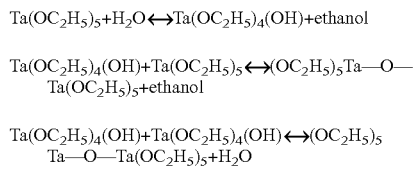

$$Ta(OC_2H_5)_5 + H_2O \leftrightarrow Ta(OC_2H_5)_4(OH) + \text{ethanol}$$

$$Ta(OC_2H_5)_4(OH) + Ta(OC_2H_5)_5 \leftrightarrow (OC_2H_5)_5Ta\!-\!O\!-\!Ta(OC_2H_5)_5 + \text{ethanol}$$

$$Ta(OC_2H_5)_4(OH) + Ta(OC_2H_5)_4(OH) \leftrightarrow (OC_2H_5)_5Ta\!-\!O\!-\!Ta(OC_2H_5)_5 + H_2O$$

The hydrolysis of tantalum ethoxide is very fast. The water content of ambient air is sufficient to initiate the hydrolysis, which is followed by slower policondensation reactions. These reactions, which form the gel network at room temperature, are followed by a thermal treatment step, where pyrolysis and release of organics, film densification and final oxide crystallization take place. Details of this sol-gel-based spin casting and/or dip-coating technology have been demonstrated in the literatures.

The individual layers were also formed by replacing $Ta_2O_5$ with any of metal oxides, complex metal oxides from one of the groups of IIA to VIIA, IB to VIIIB, and VIII. These materials are included at least in the metal oxides such as $Al_2O_3$, $In_2O_3$, $SnO_2$, $ZrO_4$, MgO, CuO, $Cu_2O$, $VO_2$, $TiO_2$, $Ta_2O_5$, $Al_2O_{3-\delta}$, $In_2O_{3-\delta}$, $SnO_{2-\delta}$, $ZrO_{4-\delta}$, $CuO_{1-\delta}$, metal complex oxides like $YBaCuO_3$, $BaTiO_3$, $YBaCuO_{3-\delta}$, $BaTiO_{3-\delta}$ and ceramic nanocomposites and the like. The individual layers were also formed by replacing $Ta_2O_5$ with any of conductor pastes including metal oxides like ITO, ZnO and metal pastes like Ag and Au. The individual layers were also formed by replacing $Ta_2O_5$ with any of silicon-based material, like polysilane.

Example 7

A $TiO_2$ film was also prepared by photochemical metal deposition. The preparation procedure is as follows: a 0.1236 g of $Ti(acac)_2(i\text{-prop})_2$ precursor of isopropanol is added into toluene (1.5 g) to form a homogenous solution. The above solution is spin cast on the substrate at approximately 2000 rpm for approximately 1 min and followed with irradiation under a UV (254 nm) light for 2 hours. The photoproduced film was then heated at 150° C. in an oven for 1 h.

The individual layers were also formed by replacing $TiO_2$ with any of metal and metal alloy, such as metal oxides and complex metal oxides from one of the groups of IIA to VIIA, IB to VIIIB, and VIII. The metal oxide materials include any of the metal oxides like CuO, $Al_2O_3$, $In_2O_3$, $SnO_2$, $VO_2$, $ZrO_4$, $TiO_{2-\delta}$, $SnO_{2-\delta}$, $CuO_{1-\delta}$ metal complex oxides like $YBaCuO_3$, $BaTiO_3$ and ceramic nanocomposites and the like.

Example 8

A layer formed from a solution including polymer/organic materials with functionalized inorganic materials was made, for example, as follows: Poly(4-vinylphenol) (PVP) (~10 wt. %) and poly(melamine-co-formaldehyde) methylated (~5 wt.-%) were dissolved in propylene glycol monomethyl ether acetate, and then blended with a certain amount of $TiO_2$ nanoparticles. The solution was used to form a thin film layer by spin coating followed by annealing/curing at 150° C. for 30 minutes.

The optical transmission of this multilayer film is less than 10%.

Experiments were also carried out by replacing PVP with other soluble organic materials like PMMA, polystyrene, PVK, PVA, polycarbonate, BCB, Silk and 4-thiphone 6-thiophone, 8-thiophone, 6-phenyl, soluble pentance, C60 derivatives like methanofullerene [6,6]-phenyl $C_{61}$-butyric acid methyl ester (PCBM) and PCBM with different alkyl chain lengths ($C_1$-$C_{16}$), by replacing $TiO_2$ with other functionalized inorganic nano-structured materials like $ZrO_4$, CaSe, PbS $Al_2O_3$, $Ta_2O_5$, $Nb_2O_5$, and by replacing $TiO_2$ with other ceramic nanocomposites like $CaSiO_3$, $BaSiO_3$ and the like. Similar functions and results were observed.

The multilayer film according to the present invention formed by wet (solution) processing can be easily applied to the fabrication of a large-screen panel by any printing technology.

Example 9

A layer formed from a solution including polymer/organic materials with functionalized inorganic materials was made, for example, as follows: polyhedral oligomeric silsequioxanes (POSS), was dissolved in tetrahydrofuran (THF), and then blended with a certain amount of $TiO_2$ nanoparticles. The solution was used to form a thin film layer by spin coating followed by annealing/curing at 150° C. for 30 minutes.

Experiments were also carried out by replacing POSS with other soluble organic materials like 4-thiphone 6-thiophone, 8-thiophone, 6-phenyl, soluble pentance, C60 derivatives like methanofullerene [6,6]-phenyl $C_{61}$-butyric acid methyl ester (PCBM) and PCBM with different alkyl chain lengths ($C_1$-$C_{16}$); by replacing POSS with soluble small molecules with function groups of triethylopropane triacrylate, tri-propylene-glycol-diacrylate, penthaerithritol triacrylate, trimethylolpropane ethoxylate triacrylate, methyl methacrylate, methacrylate, tri(propylene glycol) glycerolate diacrylate, vinylacrylate, soluble carbon molecules in sheet, sphere, or tube forms; by replacing $TiO_2$ with other functionalized inorganic nano-structured materials like $ZrO_4$, CaSe, PbS $Al_2O_3$, $Ta_2O_5$, $Nb_2O_5$, and by replacing $TiO_2$ with other ceramic nanocomposites like $CaSiO_3$, $BaSiO_3$ and the like. Similar functions and results were observed.

The multilayer film according to the present invention formed by wet (solution) processing can be easily applied to the fabrication of a large-screen panel by any printing technology.

Example 10

A change in luminous efficiency between the PLED test pixels with and without multilayer films as an encapsulation coating, were examined in fresh status at different current densities and the results thereof are shown in FIG. 7. No change in electroluminescence properties, e.g. luminance or luminous efficiency, was observed with and without multilayer films as the encapsulation coating at fresh status.

Example 11

The permeation rate for water, oxygen, was measured by analyzing the transmission coefficient of Ba over-covered with Al, followed by depositing multilayer films. A 100 nm layer of Ba was deposited on a glass substrate and over-covered with a 10 nm layer of Al by thermal evaporation, and then forming multilayer films on top of the Al layer as described in Example 1 above. The transmissions of the Ba over-covered with Al with and without multilayer films are shown in FIGS. 8 and 9.

A value of the relative change in transmission of 18% is shown in FIG. 10. The 18% change in transmission is equivalent to $\sim 10^{-5}$ g/m²/day of $H_2O$ permeated through the multilayer films.

Thus, a new and improved multilayer film for package applications has been disclosed. The multilayer film is specifically designed to encapsulate various devices susceptible to moisture and oxygen. Devices encapsulated with the multilayer films experience substantially reduced permeation of moisture and oxygen. The advantages of the multilayer films as a permeation barrier of water, oxygen and ozone are: (1) all layers involved are solution-processed; (2) all layers are processed at room temperature or temperatures below the melting point of the substrate; (3) no vacuum deposition is involved; and (4) they are conformable and can be made in flexible form or onto substrate with predefined shapes. These advantages decrease dramatically the material and processes cost and make such multilayer films promising for many packaging applications.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of forming a multilayer film for packaging applications by a solution process comprising the steps of:
    positioning a plurality of basic film structures in contiguous overlying relationship to form a multilayer film, each basic film structure of the plurality of basic film structures including one of a first two-layer structure with a first layer including a polymer/organic material and a second layer including a functionalized inorganic material, a second two-layer structure with a first layer including a polymer/organic material and a second layer including a polymer/organic binder, and a three layer structure with a first layer including a polymer/organic material, a second layer including a functionalized inorganic material, and a third layer including a polymer/organic binder; and
    the positioning, in conjunction with each layer of each of the plurality of basic film structures, including forming the materials of each layer into a solution;
    printing the solution to form each layer; and
    drying and annealing/curing the printed solution of each layer.

2. A method as claimed in claim 1 wherein the step of printing the solution includes one of spin-coating, dip-coating, bar-coating, slot-coating, fluid coating, spray coating, imprinting, gravour coating, and combinations thereof.

3. A method as claimed in claim 1 wherein the step of annealing/curing the printed solution includes heating to a temperature in a range of approximately 100° C. to approximately 300° C.

4. A method of forming a multilayer film for packaging applications by a solution process comprising the steps of:
    positioning a device to be packaged on a supporting substrate;
    forming a multilayer film by a solution process so as to surround the device and at least a portion of the substrate, the step of forming including positioning a plurality of basic film structures in contiguous overlying relationship to form a multilayer film, each basic film structure of the plurality of basic film structures including one of a first two-layer structure with a first layer including a polymer/organic material and a second layer including a functionalized inorganic material, a second two-layer structure with a first layer including a polymer/organic material and a second layer including a polymer/organic binder, and a three layer structure with a first layer including a polymer/organic material, a second layer including a functionalized inorganic material, and a third layer including a polymer/organic binder;
    the step of forming a multilayer film, in conjunction with each layer of each of the plurality of basic film structures, including forming the materials of each layer into a solution;
    coating/printing the solution to form each layer; and
    drying and annealing/curing the printed solution of each layer at a temperature lower than a melting temperature of the supporting substrate.

5. A method as claimed in claim 4 wherein the device includes one of an electric/electronic device, an opto-electric device, a battery, an electrochemical device, a biosensor, and a chemsensor.

6. A method as claimed in claim 4 wherein the step of printing the solution includes one of spin-coating, dip-coating, bar-coating, slot-coating, fluid coating, spray coating, imprinting, gravour coating, and combinations thereof.

7. A method as claimed in claim 4 wherein the step of annealing/curing the printed solution includes heating to a temperature in a range of approximately 100° C. to approximately 300° C.

* * * * *